United States Patent [19]

Hirano

[11] Patent Number: 4,685,995
[45] Date of Patent: Aug. 11, 1987

[54] PROCESS FOR MANUFACTURING CALCIUM CARBONATE SINGLE CRYSTAL

[75] Inventor: Shinichi Hirano, 123, Meidai Yada-cho Syukusya, 66, Yada-cho 2-chome, Higashi-ku, Nagoya-shi, Aichi-ken, Japan

[73] Assignees: Shinichi Hirano; Seiko Instruments & Electronics Ltd., both of Tokyo, Japan

[21] Appl. No.: 840,670

[22] Filed: Mar. 18, 1986

[30] Foreign Application Priority Data

Mar. 18, 1985 [JP] Japan ................... 60-53892

[51] Int. Cl.$^4$ .............. C30B 29/10; C30B 7/10; C01F 5/24
[52] U.S. Cl. .............. 156/623 R; 156/DIG. 78; 423/430
[58] Field of Search .............. 423/430, 431, 432; 156/623 R, DIG. 78

[56] References Cited

U.S. PATENT DOCUMENTS

| 3,271,114 | 9/1966 | Kolb | 156/DIG. 78 |
| 3,663,180 | 5/1972 | Brissot | 156/DIG. 78 |
| 4,019,950 | 4/1977 | Croxall et al. | 156/623 R |

FOREIGN PATENT DOCUMENTS

| 1049347 | 11/1966 | United Kingdom | 156/DIG. 78 |
| 431703 | 10/1975 | U.S.S.R. | 156/623 R |

OTHER PUBLICATIONS

Balascio et al., Hydrothermal Growth of Calcite from Alkali Carbonate Solutions, MAT Res Bull., vol. 7, No. 12, pp. 1461-1472, Dec. 72.

Primary Examiner—Gary P. Straub
Attorney, Agent, or Firm—Bruce L. Adams; Van C. Wilks

[57] ABSTRACT

Calcium carbonate single crystal, which can be optically used and industrialized, is produced by hydrothermal synthesis method in which the single crystal over species crystal is grown by using NaCl or KCl or LiCl aqueous solution under fixed temperature and pressure.

29 Claims, 2 Drawing Figures

PROCESS FOR MANUFACTURING CALCIUM CARBONATE SINGLE CRYSTAL

BACKGROUND OF THE INVENTION

This invention relates to process for manufacturing Calcite, calcium carbonate single crystal widely utilized as material for optical polarizers etc.

Single crystal of $CaCO_3$ calcium carbonate for optical use is known as Calcite. When rays of light are made incident upon Calcite, it is characteristic that two refracted rays are produced from each ray incident upon calcite due to double refraction phenomenon. Particularly, because its compound refraction index is high, calcite is utilizted as polarizing prism for optical apparatus. Particularly because of the recent advancement of such apparatus as laser optics and optical communication etc. utilizing optics and because of increase in marketability, material with excellent optical characteristics is demanded. In this regard, Calcite is an ideal material, which is expected to be more and more in demand.

As to calcite, it is obtainable only from natural product because it is not yet industrially and artificially synthesized. It is required that natural calcite for the above is colourless and transparent, has no bubble and no crack inside, no twin, no strain inside, and a certain degree of size. However, Calcite that meets this requirement, is produced only in such limited areas as Republic of South Africa, Mexico, etc.

Trials to synthesize calcium carbonate single crystal have so far been made in a variety of ways. Namely, they include crystallization from solvent, synthesizing from gel, crystallization from flux or melt, or hydrothermal synthesis method etc, and recent FZ method or floating-zone technique under high pressure as well. However, optical characteristics such as transparencies has not been entirely satisfactory to be industrialized due to defects such as impurities, mixing or dislocation of inclusion, or strain in crystallization inside.

Among all these tried methods, the growth atmosphere of a hydrothermal synthesis method is the most similar to that of natural Calcite grown in the hydrothermal ore deposit. Therefore, there is a possibility to synthesize the crystal having characteristics closest to natural Calcite.

This hydrothermal synthesis process is a method utilizing aqueous solution at a fixed temperature and pressure in an autoclave in order to synthesize material, and is used for quality production of artificial crystal. Alkaline aqueous solution such as NaOH or carbonate aqueous solution such as $Na_2CO_3$, $K_2CO_3$ etc. is generally used as aqueous solution. As growth solution of calcium carbonate single crystal by hydrothermal synthesis process, carbonate aqueous solution has been tried as an extension of the above stated growth technology for artificial crystal.

Solvent—6 mol $K_2CO_3$ aqueous solution
Temperature—410° C.–445° C.
Pressure—1720 atmospheric pressure
Growth speed—50 μm/day Under the above conditions, about 3 mm growth layer has been obtained.

The above described hydrothermal synthesis in the traditional manner is disclosed in the following literature: D. R. Kinlock H, R. F. Belt, R. C. Puttbac H, Journal of crystal growth 24/25 (1964) 610–613

In crystal growth method of calcium carbonate utilizing the conventional carbonate aqueous solution, crystal can be grown, but there are problems to be solved as follows:

Firstly, due to the high concentration of used solvent, there frequently occurs much inclusion in crystal. This will be a cause to obstruct optical characteristics.

Next, due to the high concentration of solvent it is impossible to control pressure by adjusting filling-up rate of solution at time of quantity-production of general artificial crystal. Namely, the higher the solvent concentration becomes, the lower the obtainable pressure becomes even with the same filling-up rate. In case of use of 6 mol concentration of $K_2CO_3$ aqueous solution at 445°, and even if the filling-up rate is made nearly 100 pct, it is unable to obtain 1720 atm. (atmospheric pressure). Due to this, it is necessary to apply an exclusive pressure addition device to the outside of the autoclave, causing the device and pressure systems etc. too complicated. Further, in case that carbonate aqueous solution is utilized, the growth speed is very slow, i.e., 50 μm/day. Therefore, it takes on the order of 1 year to grow crystal large enough to be used as optical elements. It is an object of the invention to provide a simple method to grow excellent calcium carbonate single crystal with desired characteristics of optical nature through a short period.

DETAILED DESCRIPTION

Many problems that arise in growing calcium carbonate according to the conventional hydrothermal synthesis processes, such as defects in the optical quality of the material, the apparatus being complicated, lengthened growth period, etc., results from utilizing high concentrated solvent by high pressure, in other words, the problems are caused by choice of solvent and growth condition.

Chloride aqueous solution has been found to be the best to avoid the abovementioned troubles, among various kinds of existing solvent such as alkaline, carbonate, and acid system solutions.

According to the inventive synthesis process, initiating or starting material is dissolved in the proper aqueous solution of solvent at a certain appropriate temperature and under a certain pressure, and crystallized or grown on a proper basic board by cooling gradually or by transporting nourishment (material) through a temperature differential or gradient. Therefore, it is subject to solvent that all material has to be well-dissolved and there should be little corrosive action on the autoclave. Chloride aqueous solution is a solvent ideal for such requirement.

Descriptions in detail according to the embodiments are as follows:

Embodiment 1

Figure 1:
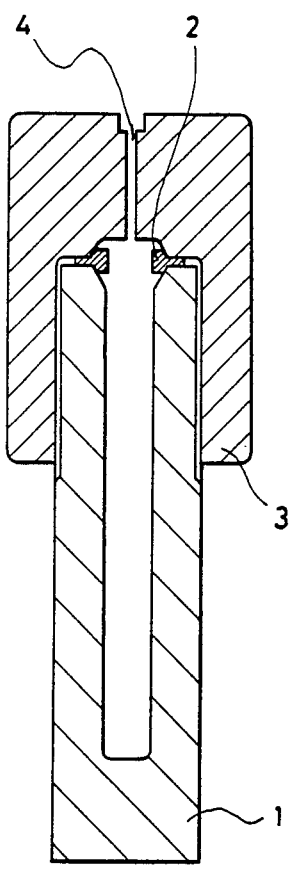
FIG. 1 is a sectional view indicating a structure of test tube.

As initiating or starting material, highly pure $CaCO_3$ available in the market is utilized. For hydrothermal treatment, a test tube of Stellite quality No. 25 was utilized. FIG. 1 is a sectional view showing the structure of the test tube. A pressure vessel body 1 is provided with a covering 3 through a sealing 2.

Inside or nutrient temperature of the pressure vessel is measured through a temperature measuring hole 4. In the test tube of the above described structure, a capsule composed of gold, 3 mm-5 mm in diameter was used, into which the above material and the solvent were poured for hydrothermal synthesis. In this case, the pressure difference between the inside and the outside of the pressure vessel has to be well-balanced by filling the inside of the vessel with distilled water.

A result of the hydrothermal treatment by each solvent is shown in the following table:

| Solvent | Hydrothermal Treatment Conditions | Crystal of $CaCO_3$ |
| --- | --- | --- |
| 3 Mol NaCl | Temp. - 470° C. Pressure - 750 kg/cm$^2$ Growth Period - 7 days | 0 |
| 3 Mol NaCl | Temp. - 520° C. Pressure - 750 kg/cm$^2$ Growth Period - 7 days | 0 |
| 3 Mol KCl | Temp. - 490° C. Pressure - 750 kg/cm$^2$ Growth Period - 7 days | 0 |
| 3 Mol LiCl | Temp. - 490° C. Pressure - 750 kg/cm$^2$ Growth Period - 7 days | 0 |
| 3 Mol LiCl | Temp. - 520° C. Pressure - 750 kg/3m$^2$ Growth Period - 7 days | 0 |
| 3 Mol NaCl | Temp. - 500° C. Pressure - 500 kg/cm$^2$ Growth Period - 7 days | 0 |

0: Indicates that crystal is grown.
X: Indicates that crystal is not grown.

As shown in the above table, it is possible to grow crystal by using NaCl, KCl, and LiCl as solvent. By making the concentration of each chloride aqueous solution large, good crystal can be grown, however it is preferable to arrange the molar concentration to about 3 Mol in view of the relation with pressure because it is easier in handling. With regard to pressure, unlike the case of carbonate aqueous solution, it is possible to grow crystal under a pressure less than 1000 kg/cm$^2$, and a very good crystal is obtained by using a pressure of 750 kg/cm$^2$, however, by using a pressure of 500 kg/cm$^2$, crystalline growth is very slow. With regard to temperature, above the range of 470° C., good crystal can be grown. In the case of temperature of over 520° C., it is possible to grow crystal, however, there is a possibility of causing trouble in the quality of crystal grown.

Among $CaCO_3$ single crystals grown with 750 kg/cm$^2$ pressure, one grown with NaCl aqueous solution is the best crystal. The result of growing crystal by this solution at different nutrient temperatures is as follows:

| Solution | Temp. | Pressure | Size of Crystal Grown |
| --- | --- | --- | --- |
| NaCl | 470° C. | 750 kg/cm$^2$ | 0.4 mm-0.5 mm |
| NaCl | 520° C. | " | 0.6 mm-1.0 mm |

The higher the growth temperature becomes, the quicker the growth speed becomes. In the case of KCl solution, its growth speed is too slow for practical use.

In the case of LiCl solution, about the same effect as in NaCl solution is gained and it is able to obtain a crystal sized over 1.0 mm at 520°.

It is confirmed by X-ray diffraction measurement that in any case the crystal grown is found a $CaCO_3$ single crystal.

Embodiment 2

Figure 2:
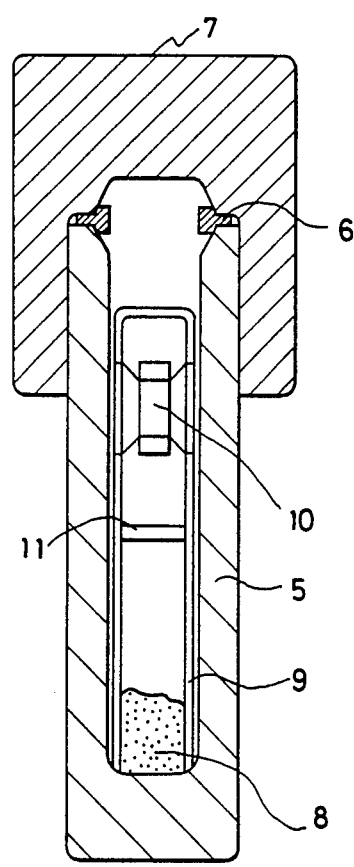
FIG. 2 is a sectional view of construction of pressure vessel.

FIG. 2 shows a sectional view illustrating a typical construction of Embodiment 2. A pressure vessel 5 is a test tube made of Stellite 25 as in embodiment 1, however the inside thereof is lined with a platinum plate in order to avoid pollution. The pressure vessel body 5 is sealed by pressure with a covering 7 through a seal ring 6. At the bottom of the pressure vessel body 5 of the test tube of the above construction, the raw or starting material 8 for the growth is placed. As the raw material 8 for the growth, initiation raw material refined and recrystallized in the NaCl solution by a method of the embodiment 1, is smashed, powdered for the use. Next, through a species crystal support frame 9, a species or seed crystal 10 is placed over the raw material 8 for growth. As the species crystal 10, Calcite with (10$\bar{1}$1) phase of natural optical grade is used. In this case, it is necessary to choose species crystal especially with little inclusion inside, and little displacement etc. so that defects in single crystal to be grown may be avoided. After this arrangement, a buffle board 11 is disposed between the raw material 8 for growth and species crystal 10 through the species crystal support frame 9. The inside of the pressure vessel composed like this, is filled up by 3 mol NaCl aqueous solution as a medium at such a filling-up rate as will enable to get the fixed temperature and pressure.

Hydrothermal treatment is conducted exactly on the same condition as shown in embodiment 1, according to the above setting-up. It is as follows:
Temperature of species crystal 10—470° C.
Temperature of raw material 8 for growth—520° C.
Solvent—3 Mol NaCl aqueous solution
Pressure—750 kg/cm$^2$
Growth period—50 days.
The temperature gradient between the species cyrstal 10 and the raw material 8 is promoted by a buffle board 11.

As a result of this treatment, $CaCO_3$ single crystal over species crystal 10 has been grown. Its result and characteristics are shown as follows:
Thickness of grown layer: 6 mm
Growth speed: 120 μm/day
Characteristics of grown layer: $CaCO_3$ single crystal (determined by the X-ray diffraction method). Its optical nature is equal to that of natural Calcite (growth layer was cut down, and its permeability rate, compound refraction index etc. were measured.)

As described above in detail, according to this invention, $CaCO_3$ single crystal is easily industrialized because of growth by pressure lower than 1000 kg/cm$^2$ and at the same time, and the inventive method is more effective on reducing defect inside crystal grown as compared with the conventional growth method of $CaCO_3$ single crystal by using carbonate aqueous solution.

In addition, the growth speed of the crystal is over twice as that of the prior method, and the grown crystal shows a very favourable characteristic in case it is industrialized. At any rate, it is very effective that, according to this invention, $CaCO_3$ single crystal with optical grade equal to that of natural Calcite is industrialized by the same technology as that for the current artificial crystal. To industrially produce such synthetic crystal equal to the natural optical grade of Calcite means to always provide such Calcite as with the same quality in the market. Because of dependence on the natural Calcite, there has always been no guarantee for the regular supply of Calcite of the same quality, and no certainty about its quality for industrial product. This industrialization of artificial Calcite is utilized for optical elements and parts etc. covering the whole range concerned, and is useful for improvement in their characteristics.

What is claimed is:

1. A method of manufacturing calcium carbonate single crystal wherein the calcium carbonate single crystal is grown by hydrothermal synthesis which applies heat and pressure to a starting material composed of calcium carbonate crystal within a chloride aqueous solution, said hydrothermal synthesis being carried out at a temperature above 470° C.

2. The method according to claim 1; wherein the starting material of said hydrothermal synthesis is composed of calcium carbonate polycrystalline.

3. The method according to claim 2; wherein said hydrothermal synthesis is carried out at a temperature below 520° C.

4. The method according to claim 1; wherein said hydrothermal synthesis is carried out under a pressure lower than 1000 kg/cm$^2$.

5. The method according to claim 1; wherein said chloride is NaCl.

6. The method according to claim 1; wherein said chloride is KCl.

7. The method according to claim 1; wherein said chloride is LiCl.

8. The method according to claim 1; wherein the chloride aqueous solution comprises 3 mol aqueous solution of chloride.

9. The method according to claim 1; wherein said hydrothermal synthesis is carried out in a pressure vessel and the calcium carbonate single crystal is deposited on the inside surface of the pressure vessel.

10. The method according to claim 1; wherein the calcium carbonate single crystal is grown on a seed crystal.

11. The method according to claim 1; wherein said hydrothermal synthesis is carried out in a pressure vessel, the starting material being placed at the bottom of said pressure vessel and a seed crystal being placed at the upper part of said pressure vessel.

12. The method according to claim 11; wherein said seed crystal is maintained about 50° C. lower than the starting material, whereby said single crystal is grown on the seed crystal.

13. The method according to claim 12; wherein said pressure vessel is provided with a baffle located in the chloride aqueous solution between the starting material and the seed crystal.

14. The method according to claim 12; wherein the seed crystal comprises calcite ($10\bar{1}1$) phase of natural optical grade.

15. The method according to claim 1; wherein said hydrothermal synthesis is carried out at a temperature below 520° C.

16. A method of manufacturing calcium carbonate single crystal comprising the steps of: providing a starting material composed of calcium carbonate; dissolving the starting material in a chloride aqueous solution under application of heat and pressure; and hydrothermally synthesizing the starting material within the chloride aqueous solution at a nutrient temperature above 470° C. establish a temperature gradient within the chloride aqueous solution effective to promote the growth of calcium carbonate single crystal.

17. A method according to claim 16; wherein the starting material is hydrothermally synthesized within the chloride aqueous solution at a nutrient temperature below 520° C.

18. A method according to claim 16; wherein the starting material is hydrothermally synthesized within the chloride aqueous solution at a pressure lower than 1000 kg/cm$^2$.

19. A method according to claim 18; wherein the starting material is hydrothermally synthesized within the chloride aqueous solution at a pressure lower than 750 kg/cm$^2$.

20. A method according to claim 16; wherein the chloride aqueous solution contains NaCl.

21. A method according to claim 16; wherein the chloride aqueous solution contains LiCl.

22. A method according to claim 16; wherein the chloride aqueous solution comprises 3 mol aqueous solution of chloride.

23. A method according to claim 16; wherein the calcium carbonate single crystal is grown as a film on a seed crystal.

24. A method according to claim 23; wherein the seed crystal comprises calcite.

25. A method according to claim 24; wherein the calcite has a ($10\bar{1}1$) phase of natural optical grade.

26. A method according to claim 16; wherein the starting material is hydrothermally synthesized within the chloride aqueous solution within a pressure vessel.

27. A method according to claim 26; wherein the starting material is placed at the bottom of the pressure vessel, and the calcium carbonate single crystal is grown as a film on a seed crystal disposed at an upper portion of the pressure vessel.

28. A method according to claim 27; wherein a baffle is disposed in the pressure vessel between the bottom and upper portion thereof to produce temperature gradient therebetween.

29. A method according to claim 28; wherein the temperature gradient is about 50° C.

* * * * *